United States Patent
Daijo

(10) Patent No.: US 8,721,128 B2
(45) Date of Patent: May 13, 2014

(54) LENS AND SEMICONDUCTOR LIGHT-EMITTING ELEMENT MODULE USING SAME

(75) Inventor: Kazuhiro Daijo, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/379,364

(22) PCT Filed: Aug. 23, 2010

(86) PCT No.: PCT/JP2010/005166
§ 371 (c)(1),
(2), (4) Date: Dec. 20, 2011

(87) PCT Pub. No.: WO2011/024427
PCT Pub. Date: Mar. 3, 2011

(65) Prior Publication Data
US 2012/0140482 A1   Jun. 7, 2012

(30) Foreign Application Priority Data

Aug. 24, 2009   (JP) .................. 2009-192815

(51) Int. Cl.
*F21V 7/04* (2006.01)
(52) U.S. Cl.
USPC .................. 362/308; 362/296.05; 362/311.02
(58) Field of Classification Search
USPC ............... 362/259, 308, 296.05, 311.02, 327
See application file for complete search history.

(56) References Cited

U.S. PATENT DOCUMENTS

| | | | |
|---|---|---|---|
| 2007/0279904 A1* | 12/2007 | Tasch et al. | 362/235 |
| 2008/0030691 A1* | 2/2008 | Godo | 362/296 |
| 2010/0284194 A1* | 11/2010 | Miyashita et al. | 362/311.09 |
| 2011/0216543 A1* | 9/2011 | Kayanuma | 362/311.01 |
| 2013/0223081 A1* | 8/2013 | Jiang et al. | 362/327 |

FOREIGN PATENT DOCUMENTS

| | | |
|---|---|---|
| JP | 2004-516684 A | 6/2004 |
| JP | 2005-353816 A | 12/2005 |
| WO | WO 02/052656 A1 | 7/2002 |

OTHER PUBLICATIONS

International Search Report for Application No. PCT/JP2010/005166, Publication Date Oct. 5, 2010, Panasonic Corporation.

\* cited by examiner

Primary Examiner — David V Bruce
(74) Attorney, Agent, or Firm — RatnerPrestia

(57) ABSTRACT

A lens has a light-incoming face, a light-outgoing face, and a side face. The light-incoming face is disposed near a light source or in contact with the light source. The light-outgoing face is provided opposite to the light-incoming face. The side face has a curved total reflection surface that totally reflects a light beam that has entered the light-incoming face. The total reflection surface is formed so that light beams that have reflected off the total reflection surface focus in a given angle from the light-outgoing face.

4 Claims, 5 Drawing Sheets

LENS AND SEMICONDUCTOR LIGHT-EMITTING ELEMENT MODULE USING SAME

This application is a U.S. national phase application of PCT International Application PCT/JP2010/05166.

TECHNICAL FIELD

The present invention relates to a lens having a light-incoming face to which light from a light source is input and a light-outgoing face from which the light that has entered the light-incoming face is emitted to an object side, and to a semiconductor light-emitting element module using the lens.

BACKGROUND ART

A semiconductor light-emitting element such as a light-emitting diode (LED) is used as a point source for a light source for camera shooting of a mobile phone. To effectively use light emitted from a point source such as an LED, a collimator lens is used, which emits a maximum amount of light as parallel light (refer to patent literature 1 for example).

The collimator lens disclosed in patent literature 1 has a recess formed therein as a space for accommodating an LED. The recess is enclosed with a first face, which is a curved face formed opposite to the optical axis of the LED; and a refractive inner wall, which is a curved face. The first face forms a light-incoming face for letting light into the lens. The refractive inner wall is provided to let light that deviates laterally outward from the optical axis out of light from the LED, into the lens. The outer face formed largely expanding from the recess to the outside has a curved total reflection face formed therein.

This configuration, however, requires two major components: a recess and an outer face largely expanding outside the recess, which prevents the width from becoming smaller, resulting in a large-size collimator lens.

CITATION LIST

Patent Literature

PTL 1 Japanese Translation of PCT Publication No. 2004-516684

SUMMARY OF THE INVENTION

The present invention provides a lens that can be downsized and a semiconductor light-emitting element module using the lens. The lens of the present invention includes a light-incoming face, a light-outgoing face, and a side face. The light-incoming face is positioned near a light source or is in contact with the light source. The light-outgoing face is placed opposite to the light-incoming face. The side face has a curved total reflection surface that totally reflects light that has entered the light-incoming face. The total reflection surface is formed so as to focus light beams that have reflected off the total reflection surface within a given angle from the light-outgoing face.

This configuration, in which the space between the light-incoming face and the light-outgoing face serves as the main body, dispenses with a conventional, unnecessary space in the recess, thereby proportionately suppressing the vertical size of the lens. Hence, the configuration suppresses upsizing the lens and implements downsizing the lens, unlike a conventional collimator. Furthermore, light that has reflected off the curved total reflection surface formed on at least part of the outer side of the main body focuses within a given angle centering on the optical axis of the lens, from the light-outgoing face. Consequently, light emitted from a point source such as an LED can be effectively used.

DESCRIPTION OF EMBODIMENTS

Figure 1:
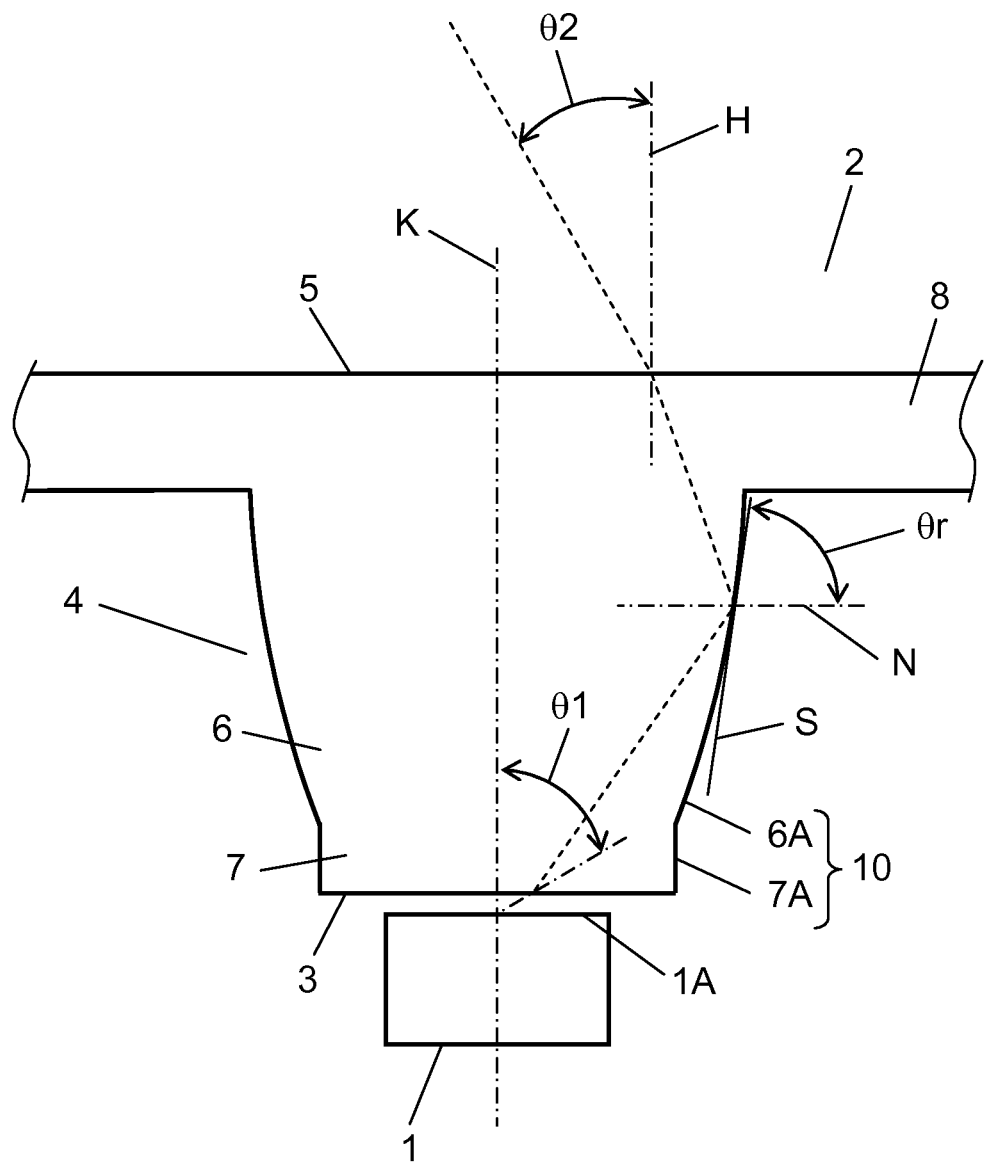
FIG. 1 is an enlarged side view showing a semiconductor light-emitting element module according to an embodiment of the present invention.
Figure 2:
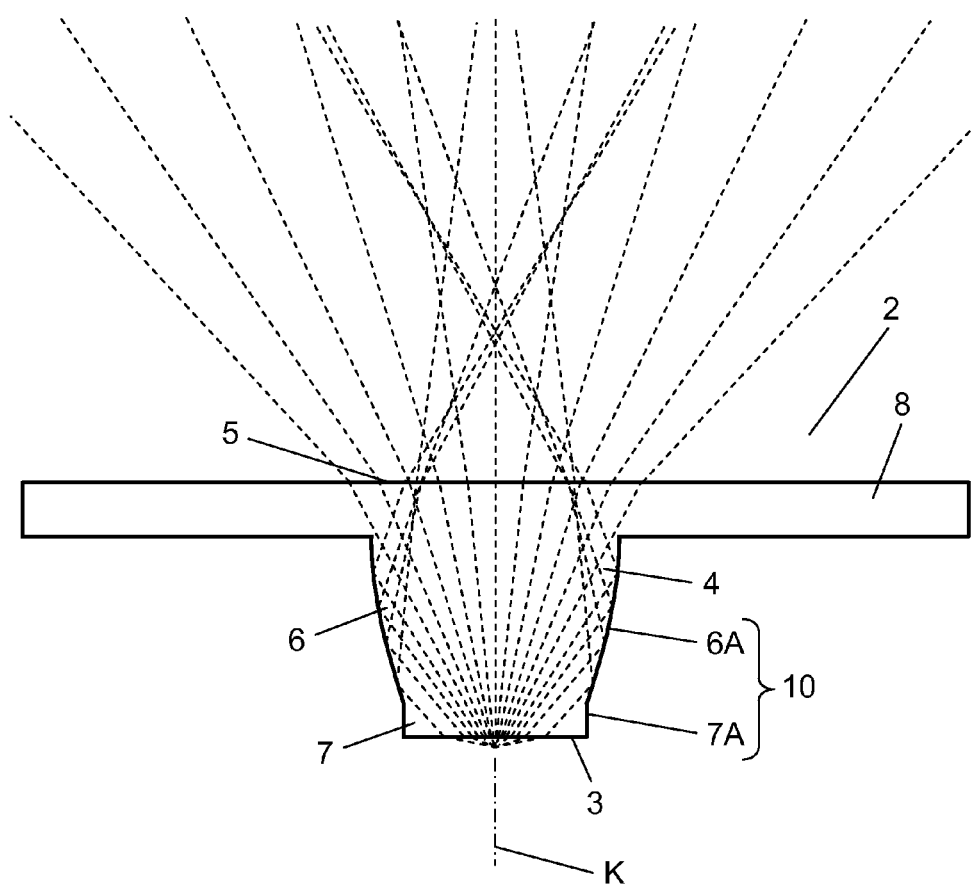
FIG. 2 is an explanatory diagram showing the orientation of light that has entered the lens of the semiconductor light-emitting element module shown in FIG. 1.
Figure 3A:
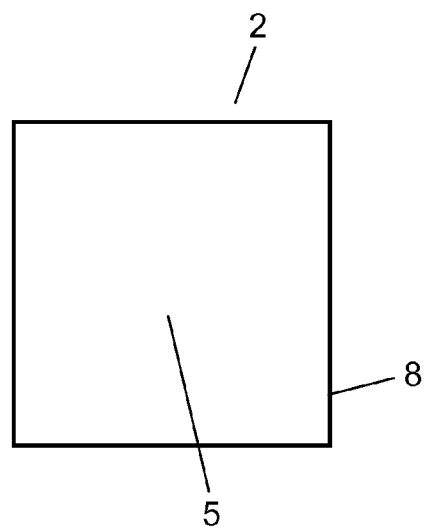
FIG. 3A is a plan view of the lens shown in FIG. 2.
Figure 3B:
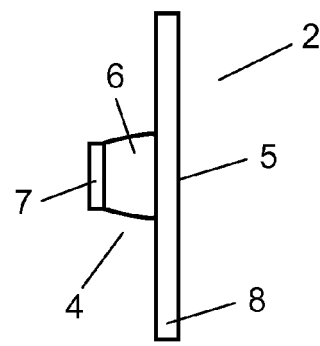
FIG. 3B is a left side view of the lens shown in FIG. 2.
Figure 3C:
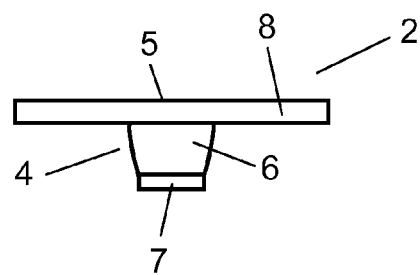
FIG. 3C is a front view of the lens shown in FIG. 2.

FIG. 1 is an enlarged side view showing a configuration of a semiconductor light-emitting element module according to an embodiment of the present invention. FIG. 2 is an explanatory diagram showing the orientation of light that has entered the lens of the semiconductor light-emitting element module shown in FIG. 1. FIGS. 3A, 3B, and 3C are respectively a plan view, left side view, and front view of the lens shown in FIG. 2. The semiconductor light-emitting element module is composed of a light source (point source) 1 (e.g. an LED mounted on a substrate (not shown) for example); and lens 2 disposed in front of light-outgoing face 1A of light source 1. Light source 1, which is a chip LED, has a reflector. The shape of the reflector can be round, oval, square, or polygonal for example in planar view. Such a semiconductor light-emitting element module is incorporated into a device such as a mobile phone.

Lens 2 is integrally molded with resin for example. Lens 2 has main body 4 including light-incoming face 3, light-outgoing face 5, and side face 10; and flange 8.

Light-incoming face 3, a flat surface, is nearly in contact with light source 1. "Nearly in contact" refers to a state in which light-outgoing face 1A of light source 1 is the closest possible to light-incoming face 3 to generate a small clearance between light-incoming face 3 and light-outgoing face 1A of light source 1, including a state in which light-outgoing face 1A of light source 1 is in contact with light-incoming face 3. In other words, light-incoming face 3 is disposed near light source 1 or in contact with light source 1.

Main body 4 extends to an object side from light-incoming face 3, and flat light-outgoing face 5 is formed on the object-side end face of main body 4. That is, light-outgoing face 5 is provided opposite to light-incoming face 3.

Side face 10 provided between light-incoming face 3 and light-outgoing face 5 is composed of curved (outward convex) total reflection surface 6A; and column-shaped surface 7A. That is, side face 10 has curved total reflection surface 6A that totally reflects light that has entered light-incoming face 3.

To sum up, as shown in FIGS. 1, 2, 3A, 3B, and 3C, main body 4 includes column-shaped part 7 formed with the same diameter as light-incoming face 3; and barrel-shaped part 6 provided on the side of column-shaped part 7 close to light-outgoing face 5. The side face of barrel-shaped part 6 is formed of total reflection surface 6A with a length longer than column-shaped surface 7A (i.e. the side face of column-shaped part 7) in the direction of optical axis K. The side face of barrel-shaped part 6 is a gently curved face whose diameter gradually increases toward the top. Concretely, total reflection surface 6A is formed so that light beams that have reflected off total reflection surface 6A focuses within a given angle from light-outgoing face 5. More specifically, barrel-shaped part 6 is formed so that light beams that have reflected off total reflection surface 6A focus within a given angle from light-outgoing face 5, $\theta_2 < 45°$ for example, where $\theta_2$ is an angle of a light beam going out from light-outgoing face 5 with respect to a normal line H to light-outgoing face 5.

Square flange 8 is provided to fix lens 2 to the housing (not shown). Flange 8 is formed on the side of barrel-shaped part 6 closer to light-outgoing face 5.

The configuration of main body 4 enables effectively using light emitted from light source 1 (an LED here) even while downsizing lens 2.

More specifically, main body 4 preferably satisfies the conditional expression below. Here, assumption is made that $\theta_1$ is an angle of a light beam entering light-incoming face 3 from the center of light source 1 with respect to an optical axis K of lens 2; $\theta_r$ is an angle between external tangent S of total reflection surface 6A (irradiated with a light beam that has entered lens 2 from light-incoming face 3 at incident angle $\theta_1$) and horizontal axis N (perpendicular to optical axis K); and n is the refractive index of lens 2. Then preferably, $\theta_2 < 45°$, $\theta_1 > \theta_2$, $30° < \theta_1 < 90°$, and conditional expression (1) are satisfied.

[Expression 1]

$$a\sin(\sin\theta_2/n) + (90° - \theta_r) = a\sin(\sin\theta_1/n) - (90° - \theta_r) \quad (1)$$

Forming barrel-shaped part 6 satisfying such a relationship enables effectively using light emitted from light source 1 with small lens 2.

In a case where lens 2 satisfying the above-described relationship is used, when light that has entered light-incoming face 3 reflects off total reflection surface 6A of barrel-shaped part 6 and leaves light-outgoing face 5, an example of a light angle at each face is shown in table 1, where refractive index n of lens 2 is 1.49.

TABLE 1

| $\theta_1$ | $\theta_2$ | $\theta_r$ |
|---|---|---|
| 80 | −20 | 62.678911 |
| 70 | 10 | 73.796653 |
| 60 | −10 | 68.885324 |
| 50 | −5 | 72.853867 |
| 40 | −20 | 70.58664 |
| 40 | 20 | 83.856851 |
| 30 | −20 | 73.561279 |
| 30 | 30 | 90 |

The Equation $\theta_1 = 90°$ means a direction perpendicular to optical axis K, and thus a light beam is not emitted from light source 1 as a point source in this direction. Meanwhile, the refractive index of material forming lens 2 is approximately 1.4 to 1.7 in a typical case, and thus the angle between the direction in which a light beam that has entered light-incoming face 3 travels and optical axis K is considerably small at $\theta_1 = 30°$. Hence, for such a light beam to irradiate total reflection surface 6A, the length of barrel-shaped part 6 in the direction along optical axis K needs to be increased, which means lens 2 is upsized. Therefore, it can be suggested that small lens 2 can moderately collect light when $\theta_2$ is within a certain range at $30° < \theta_1 < 90°$. Table 1 shows that $\theta_2$ is within ±30°.

FIG. 2 shows the orientation of light that has entered lens 2. FIG. 2 proves that the number of light beams emitted to the central portion of optical axis K is greater than that emitted to the outside of the central portion. In this way, light can be effectively collected with barrel-shaped part 6 satisfying the above relationship.

Figure 4:
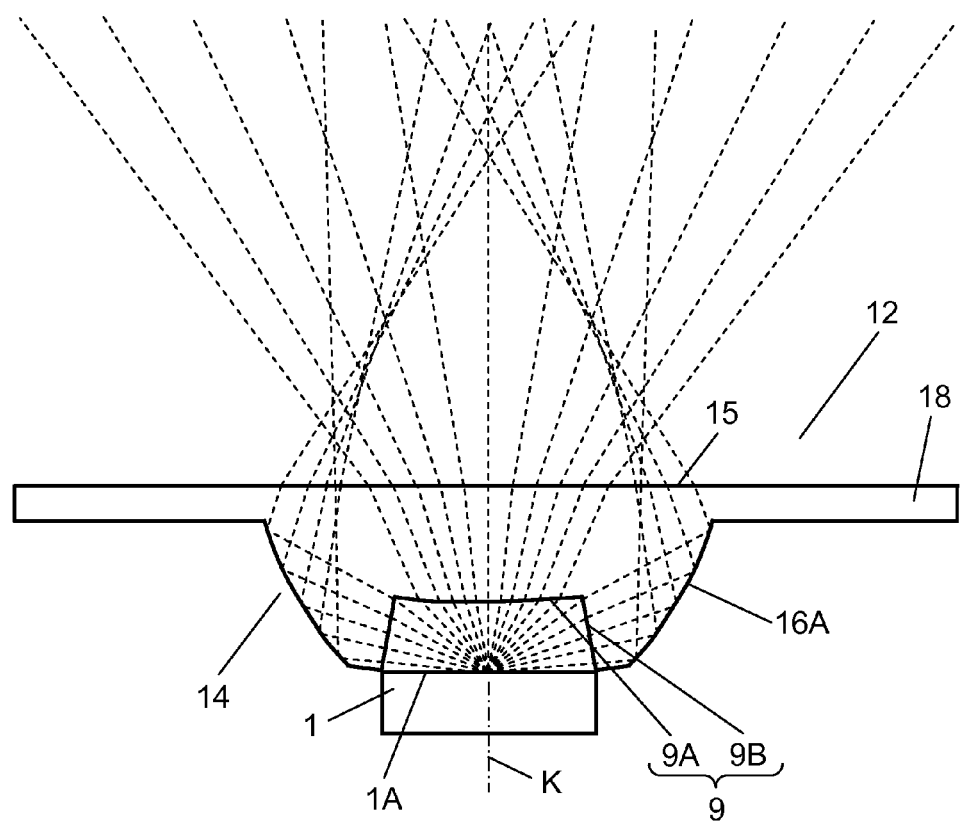
FIG. 4 is an explanatory diagram showing the orientation of light that has entered another lens used for a semiconductor light-emitting element module according to the embodiment of the present invention.

In the configuration shown in FIG. 1, light-incoming face 3 is formed flat; however, the present invention is not limited to this shape. As shown in FIGS. 4 and 5A through 5D, recess 9 may be formed that is recessed so as to cover light-outgoing face 1A of light source 1. FIG. 4 is an explanatory diagram showing the orientation of light that has entered another lens used for a semiconductor light-emitting element module according to the embodiment of the present invention. FIGS. 5A, 5B, 5C, and 5D are respectively a plan view, left side view, front view, and longitudinal sectional view of the lens shown in FIG. 4.

Lens 12, integrally molded with resin for example in the same way as lens 2, has main body 14 and flange 18. Main body 14 includes flat light-outgoing face 15 and side face 16A formed of a curved total reflection surface, and has recess 9 formed in the back side of light-outgoing face 15. The diameter of main body 14 gradually increases toward the top (i.e. light-outgoing face 15). Recess 9 forms a light-incoming face.

Recess 9 is enclosed with upper wall surface 9A facing light-outgoing face 1A of light source 1; and circumferential wall surface 9B that receives light emitted to the lateral side from light-outgoing face 1A of light source 1. Upper wall surface 9A is a gently curved face positioned lower toward optical axis K. Circumferential wall surface 9B is a gently curved face positioned closer to optical axis K at longer distances from light source 1 (at shorter distances toward the top).

FIG. 4 shows the orientation of light. In this case as well, FIG. 4 proves that the number of light beams emitted to optical axis K is greater than that emitted to the outside of optical axis K.

As shown in FIG. 4, even if lens 12 has recess 9, lens 12 produced so as to satisfy the above conditional expression prevents light from diffusing outward of main body 14. Hence, light emitted from light source 1 (an LED here) can be effectively used while upsizing lens 2 being suppressed.

Figure 5A:
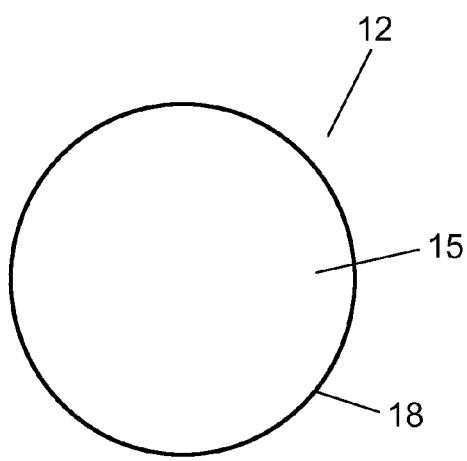
FIG. 5A is a plan view of the lens shown in FIG. 4.
Figure 5B:
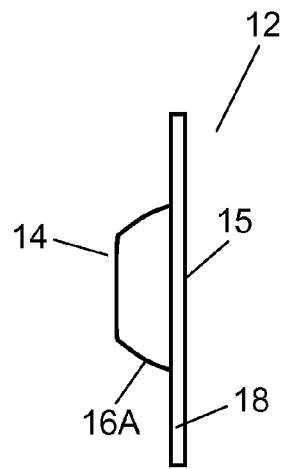
FIG. 5B is a left side view of the lens shown in FIG. 4.
Figure 5C:
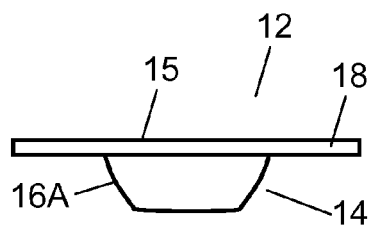
FIG. 5C is a front view of the lens shown in FIG. 4.
Figure 5D:
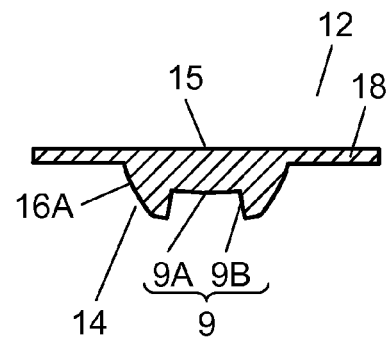
FIG. 5D is a longitudinal sectional view of the lens shown in FIG. 4.

In FIG. 5A, flange 18 is round while flange 8 shown in FIG. 3A is square; however, flange 8 or 18 may be of another different shape. Further, a column-shaped part may be provided on the top of flange 8 or 18. Alternately, flange 8 or 18 may be omitted, and lens 2 or 12 may be formed of only main body 4 or 14.

Main body 4 of lens 2 shown in FIG. 1 is composed of barrel-shaped part 6 and column-shaped part 7; however, main body 4 may be formed of only barrel-shaped part 6 with its entire outer side surface formed of total reflection surface 6A, like main body 14 of lens 12 shown in FIG. 4. Column-shaped part 7 is a part that does not influence light beams passing through the inside of main body 4 as shown in FIG. 2; its shape is not subject to constraints. In this embodiment, column-shaped part 7 is provided to position lens 2 with respect to an attached body such as a substrate. That is, inserting column-shaped part 7 into a through hole provided in the attached body allows lens 2 to be positioned with respect to the attached body.

The example is shown where light source 1 is formed of an LED; however, light source 1 may be formed of a semiconductor laser element for example.

The present invention is not limited to the above-described exemplary embodiment, but various types of modifications may be added within a scope that does not deviate from the gist of the present invention.

INDUSTRIAL APPLICABILITY

In a lens of the present invention, at least part of the side face connecting the light-incoming face with the light-outgoing face is formed of a curved total reflection surface that totally reflects a light beam that has entered the light-incoming face. The curved face of the total reflection surface is shaped so that the light that has reflected off the total reflection surface focuses within a given angle from the light-outgoing face. The configuration enables downsizing the lens. The lens and a semiconductor light-emitting element module using the lens are useful for such as a mobile phone with camera function, digital camera, monitoring camera, and vehicle-mounted camera.

REFERENCE MARKS IN THE DRAWINGS

1 Light source
1A Light-outgoing face
2, 12 Lens
3 Light-incoming face
4, 14 Main body
5, 15 Light-outgoing face
6 Barrel-shaped part
6A Total reflection surface
7 Column-shaped part
8, 18 Flange
Recess
9A Upper wall surface
9B Circumferential wall surface
10, 16A Side face

The invention claimed is:

1. A lens comprising:
 a light-incoming face disposed near a light source or in contact with the light source;
 a light-outgoing face disposed opposite to the light-incoming face; and
 a side face having a convex total reflection surface that totally reflects a light beam from the light source which enters through the light-incoming face,
 wherein a curvature of the total reflection surface is formed according to a predetermined condition so that the light beam reflected off the total reflection surface focuses within a predetermined angle from the light-outgoing face, the predetermined angle being relative to a line normal to the light-outgoing face.

2. The lens of claim 1 having a shape so formed that satisfies
 $\theta_2 < 45°$, $\theta_1 > \theta_2$, $30° < \theta_1 < 90°$, and conditional expression (1)

$$a\sin(\sin\theta_2/n)+(90°-\theta_r)=a\sin(\sin\theta_1/n)-(90°-\theta_r) \qquad (1)$$

where $\theta_1$ is an incident angle of the light beam from the light source entering the light-incoming face from a center of the light source with respect to an optical axis of the lens; $\theta_2$ is the predetermined angle of the reflected light beam going out from the light-outgoing face with respect to the line normal to the light-outgoing face; $\theta_r$ is an angle between an external tangent of the total reflection surface at a point irradiated with the light beam which enters the lens from the light-incoming face at the incident angle $\theta_1$ and a horizontal axis perpendicular to the optical axis; and n is a refractive index of the lens.

3. A semiconductor light-emitting element module comprising:
 a light source formed of a semiconductor light-emitting element; and
 the lens of claim 1, disposed at one side of the light source next to the light-outgoing face.

4. The semiconductor light-emitting element module of claim 3 so formed that satisfies
 $\theta_2 < 45°$, $\theta_1 > \theta_2$, $30° < \theta_1 < 90°$, and conditional expression (1)

$$a\sin(\sin\theta_2/n)+(90°-\theta_r)=a\sin(\sin\theta_1/n)-(90°-\theta_r) \qquad (1)$$

where $\theta_1$ is an incident angle of the light beam from the light source entering the light-incoming face from a center of the light source with respect to an optical axis of the lens; $\theta_2$ is the predetermined angle of the reflected light beam going out from the light-outgoing face with respect to the line normal to the light-outgoing face; $\theta_r$ is an angle between an external tangent of the total reflection surface at a point irradiated with the light beam which enters the lens from the light-incoming face at the incident angle $\theta_1$ and a horizontal axis perpendicular to the optical axis; and n is a refractive index of the lens.

* * * * *